(12) United States Patent
Douskey et al.

(10) Patent No.: US 10,234,507 B2
(45) Date of Patent: Mar. 19, 2019

(54) IMPLEMENTING REGISTER ARRAY (RA) REPAIR USING LBIST

(71) Applicant: International Business Machines Corporation, Armonk, NY (US)

(72) Inventors: Steven M. Douskey, Rochester, MN (US); Michael J. Hamilton, Rochester, MN (US); Amanda R. Kaufer, Rochester, MN (US); Phillip A. Senum, Rochester, MN (US)

(73) Assignee: International Business Machines Corporation, Armonk, NY (US)

( * ) Notice: Subject to any disclaimer, the term of this patent is extended or adjusted under 35 U.S.C. 154(b) by 77 days.

(21) Appl. No.: 15/214,767

(22) Filed: Jul. 20, 2016

(65) Prior Publication Data

US 2018/0024189 A1 Jan. 25, 2018

(51) Int. Cl.
*G01R 31/3185* (2006.01)
*G01R 31/3187* (2006.01)
*G11C 29/12* (2006.01)
*G11C 29/32* (2006.01)
*G11C 29/44* (2006.01)

(52) U.S. Cl.
CPC ... *G01R 31/3187* (2013.01); *G01R 31/31853* (2013.01); *G11C 29/12* (2013.01); *G11C 29/44* (2013.01); *G11C 29/4401* (2013.01); *G11C 29/32* (2013.01); *G11C 2029/3202* (2013.01)

(58) Field of Classification Search
CPC ..... G11C 29/12; G11C 29/44; G11C 29/4401; G11C 29/32; G11C 2029/3202; G11C 2029/0401; G01R 31/3187; G01R 31/31853

USPC .................................................. 714/710, 733
See application file for complete search history.

(56) References Cited

U.S. PATENT DOCUMENTS

| | | | |
|---|---|---|---|
| 5,910,921 A | 6/1999 | Beffa et al. | |
| 6,928,598 B1* | 8/2005 | Agrawal | G01R 31/31855 714/726 |
| 7,155,643 B2* | 12/2006 | Ichikawa | G11C 29/44 365/201 |
| 7,257,745 B2* | 8/2007 | Huott | G01R 31/31856 365/201 |
| 7,284,166 B2 | 10/2007 | Zappa et al. | |
| 7,290,186 B1* | 10/2007 | Zorian | G11C 29/12015 714/718 |

(Continued)

FOREIGN PATENT DOCUMENTS

| | | |
|---|---|---|
| DE | EP1517334 A1 | 3/2005 |
| DE | EP1517334 B1 | 3/2005 |

OTHER PUBLICATIONS

Lu et al., "Built-in Scrambling Analysis for Yield Enhancement of Embedded Memories", 2014 IEEE 23rd Asian Test Symposium, 2014.

*Primary Examiner* — James C Kerveros
(74) *Attorney, Agent, or Firm* — Joan Pennington

(57) ABSTRACT

A method and circuit for implementing register array repair using Logic Built In Self Test (LBIST), and a design structure on which the subject circuit resides are provided. Register array repair includes identifying and creating a list of any repairable Register Arrays (RAs) that effect an LBIST fail result. Next a repair solution is detected for each of the repairable Register Arrays (RAs) isolating a failing location for the detected repair solution for each array.

20 Claims, 8 Drawing Sheets

(56) References Cited

U.S. PATENT DOCUMENTS

| | | |
|---|---|---|
| 7,415,640 B1* | 8/2008 | Zorian .................. G11C 29/44 |
| | | 365/200 |
| 7,415,641 B1* | 8/2008 | Behera .................. G11C 29/16 |
| | | 365/201 |
| 7,475,315 B1 | 1/2009 | Natarajan et al. |
| 7,757,135 B2* | 7/2010 | Nadeau-Dostie ........................... |
| | | G11C 29/4401 |
| | | 714/711 |
| 7,890,721 B2 | 2/2011 | Lee |
| 8,942,051 B2 | 1/2015 | Adham et al. |

* cited by examiner

IMPLEMENTING REGISTER ARRAY (RA) REPAIR USING LBIST

FIELD OF THE INVENTION

The present invention relates generally to the data processing field, and more particularly, relates to a method and circuit for implementing register array repair using Logic Built In Self Test (LBIST) for repairable Register Arrays (RAs), and a design structure on which the subject circuit resides.

DESCRIPTION OF THE RELATED ART

A failure detected by LBIST within repairable Register Arrays (RA) currently goes unrepaired with resulting partial good area of full chip yield loss. Current manual LBIST diagnostic isolation is too expensive to recover these parts.

Historically Register Arrays (RAs) are made up of an array of latches and do not include any repairable elements. These arrays are not tested via Array Built In Self Test (ABIST), but rather like normal combinational logic tested with automatic test pattern generation (ATPG) and LBIST.

ABIST, typically used to test and isolate failures in arrays for repair, is not practical for these small RAs, so has not been added. Instead, the standard ATPG/LBIST tests need to be modified to support this repair. Any repair requires not only detection, but also isolation of the failing location. Unlike ABIST, ATPG/LBIST are not designed with repair isolation in mind and would require numerous extra (often manual) routines to isolate the failing location. They would need to separate repairable fails from others (difficult as non-RA related fails can have the same detection point), repair the RA and then rerun to verify repair.

A need exists for an effective method and circuit for implementing register array repair using Logic Built In Self Test (LBIST) for repairable Register Arrays (RAs).

SUMMARY OF THE INVENTION

Principal aspects of the present invention are to provide a method and circuit for implementing register array repair using Logic Built In Self Test (LBIST) for repairable Register Arrays (RAs), and a design structure on which the subject circuit resides. Other important aspects of the present invention are to provide such method, circuit and design structure substantially without negative effects and that overcome many of the disadvantages of prior art arrangements.

In brief, a method and circuit for implementing register array repair using Logic Built In Self Test (LBIST), and a design structure on which the subject circuit resides are provided. Register array repair includes identifying and creating a list of any repairable Register Arrays (RAs) that effect an LBIST fail result. Next a repair solution is detected for each of the repairable Register Arrays (RAs) isolating a failing location for the detected repair solution for each array.

In accordance with features of the invention, each of the plurality of Register Arrays (RAs) includes a selectable iterate on each array repair data segment, the selectable iterate including an enable latch in a scan path for each focus array to allow iterating through repair trials responsive to a trigger signal from LBIST.

In accordance with features of the invention, if a failure exist on one of the two edge columns of the fail array then a walking repair results in only two signatures S1 and S2, and one of those will occur only once. The repair that created that single instance signature will indicate which edge to repair.

In accordance with features of the invention, a non-edge fail results in three signatures S1, S2 and S3. For most locations one of these will occur only once, which indicates the location of the repair. On the two locations just inside of the edge columns, two of the three signatures will have a single instance.

In accordance with features of the invention, when the repair is found it is applied before the next isolation as one array repair may effect the repair of another. One other three signature pattern results when both edge columns fail. In this case the two single occurring signatures are when each edge is repaired. This pattern and any other with 4 or more signatures indicates that the array cannot be repaired. However, if a non-repairable array is in a non-critical area, such as a partial good (PG) area, repair isolation can be continued on the next array.

BRIEF DESCRIPTION OF THE DRAWINGS

The present invention together with the above and other objects and advantages may best be understood from the following detailed description of the preferred embodiments of the invention illustrated in the drawings, wherein.

DETAILED DESCRIPTION OF THE PREFERRED EMBODIMENTS

In the following detailed description of embodiments of the invention, reference is made to the accompanying drawings, which illustrate example embodiments by which the invention may be practiced. It is to be understood that other embodiments may be utilized and structural changes may be made without departing from the scope of the invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

In accordance with features of the invention, a method and circuit for implementing register array repair using Logic Built In Self Test (LBIST) for repairable Register Arrays (RAs), and a design structure on which the subject circuit resides are provided.

Figure 1A:
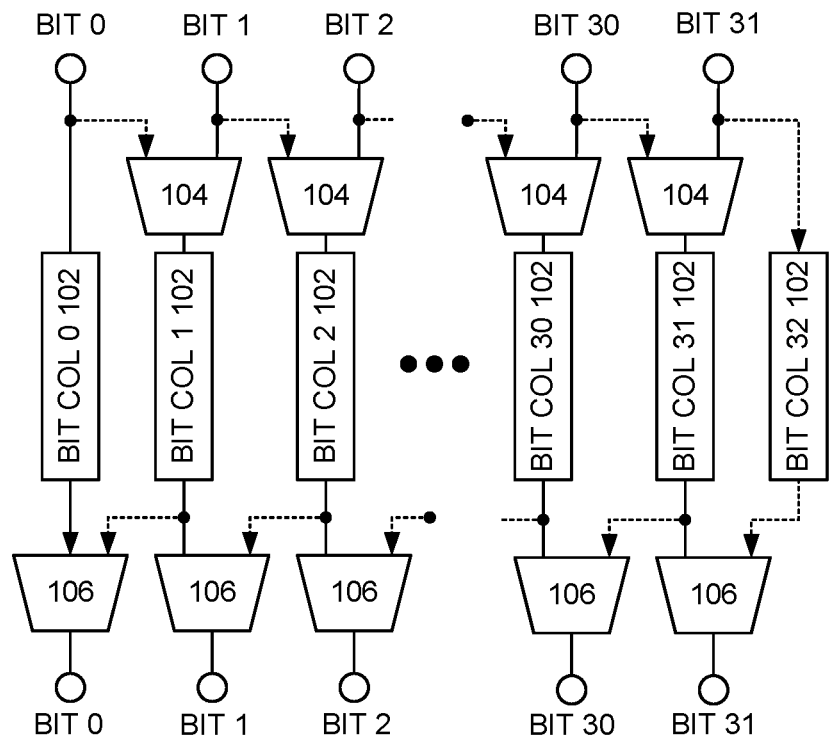
FIGS. 1A, 1B, and 1C illustrate example repairable array reconfigurations in accordance with preferred embodiments.
Figure 1B:
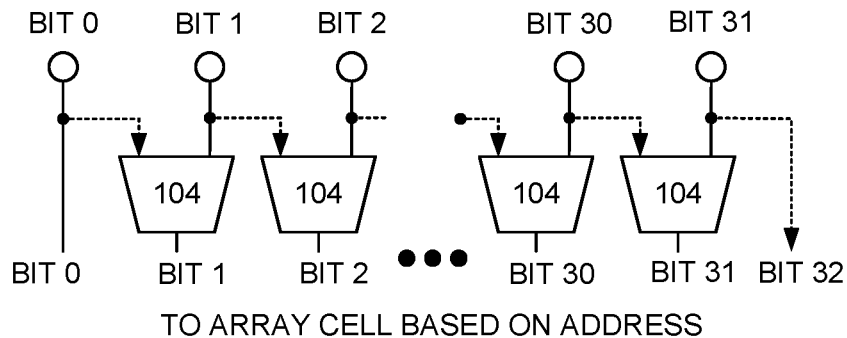
Figure 1C:
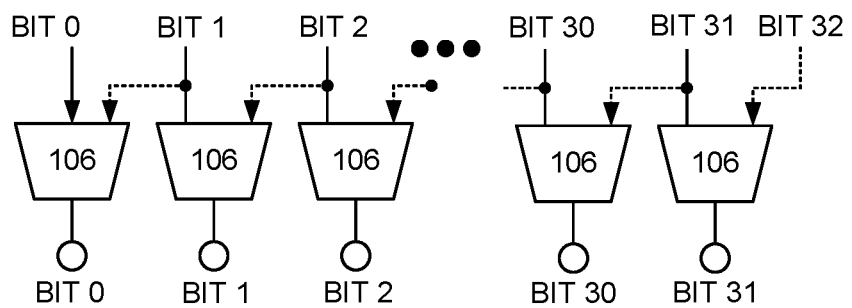

Having reference now to the drawings, in FIGS. 1A, 1B, and 1C, together there is shown an example repairable array arrangement. RAs have been enhanced to include redundant elements making a single repair possible.

In FIGS. 1A, 1B, and 1C, there is shown an example repairable array including logical scan reconfiguration generally designated by the reference character 100 in FIG. 1A, logical write reconfiguration generally designated by the reference character 110 in FIG. 1B, and logical read reconfiguration generally designated by the reference character 120 in FIG. 1C in accordance with a preferred embodiments. Repairable array 100 includes a plurality of bit columns 0-32, 102 including a redundant bit column 102 of bit columns 0-32, 102. Repairable array 100 includes a respective multiplexer 104 coupling a respective input or write bit, BIT 0-BIT 31 to an array cell based on address, as shown in FIGS. 1A, and 1B. Repairable array 100 includes a respective multiplexer 106 coupling a respective output or read bit, BIT 0-BIT 31 from an array cell based on address, as shown in FIGS. 1A, and 1C.

The scan repair is accomplished by replacing a failing bit column 102 of bit columns 0-32, 102 with a next adjacent column. That next adjacent column is further replaced by its next adjacent column, and the like, until all columns to the right of the failure as shown in FIG. 1A are shifted. Note also that the logical read and write paths illustrated in FIGS. 1B, and 1C are similarly shifted to working locations. As such the repaired RA externally looks identical to an unrepaired RA for any repair for both function and scan.

Figure 2:
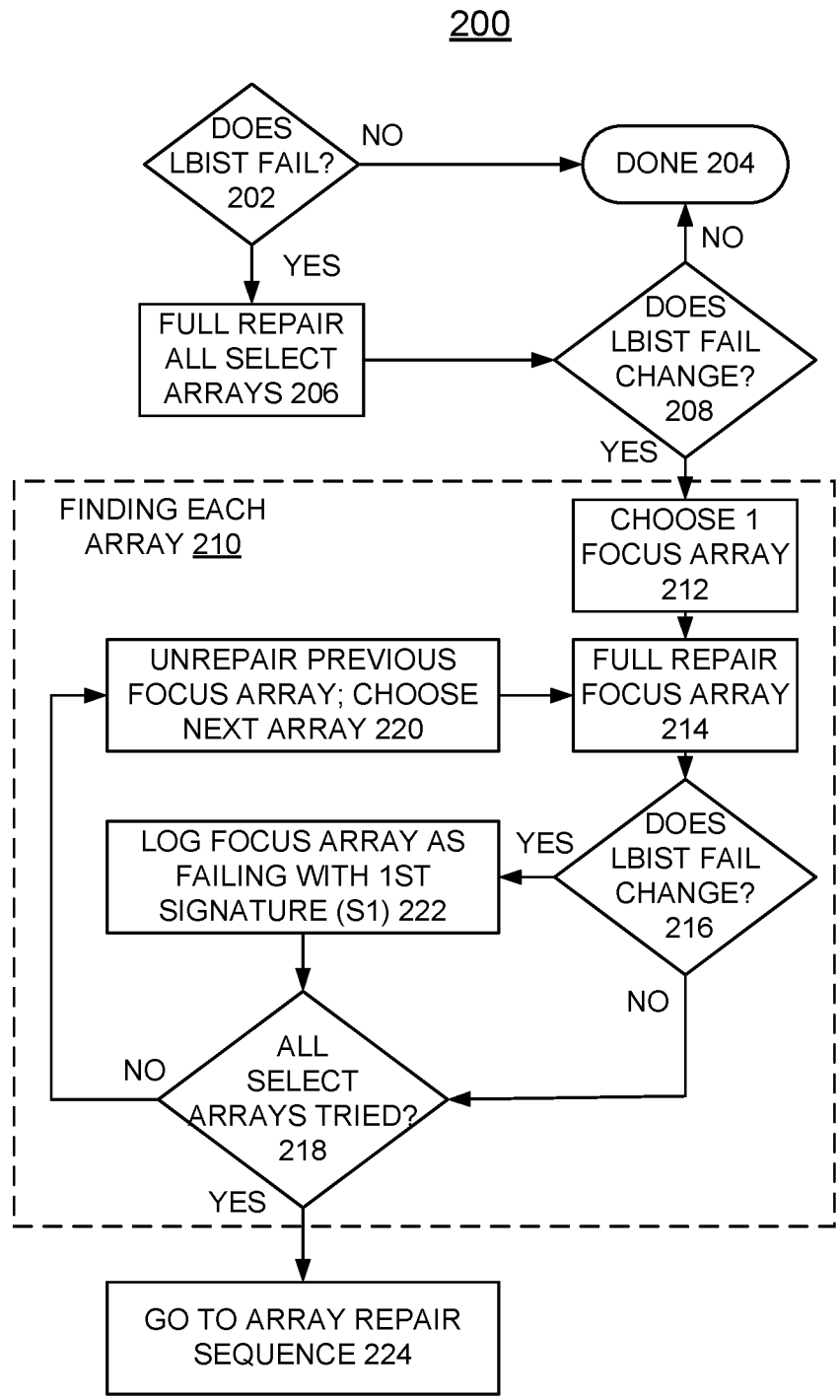
FIG. 2 is a flow chart illustrating example operations for implementing register array repair using Logic Built In Self Test (LBIST) of FIGS. 1A, 1B, 1C including example operations identifying any repairable RAs that effect the LBIST results in accordance with preferred embodiments.

Referring also to FIG. 2, there are shown example operations for implementing register array repair using Logic Built In Self Test (LBIST) of FIGS. 1A, 1B, 1C including example operations identifying any repairable RAs that effect the LBIST results generally designated by the reference character 200 in accordance with preferred embodiments. Checking for an LBIST fail is performed as indicated at a decision block 202. When no LBIST fail is identified, the operations are complete as indicated at a block 204. When an LBIST fail is identified, a full repair all select array is provided as indicated at a block 206. Checking for an LBIST fail change is performed as indicated at a decision block 208. When no LBIST fail change is identified, the operations are complete at block 204 and are not considered repairable using array repair. When an LBIST fail change is identified, finding each array is performed generally designated by the reference character 210, starting with choosing 1 focus array as indicated at a decision block 212. A full repair focus array is provided as indicated at a block 214. Checking for an LBIST fail change is performed as indicated at a decision block 216. When no LBIST fail change is identified, checking for all select arrays tried is performed as indicated at a decision block 218. When all select arrays are not tried, then the previous focus array is unrepaired, and a next focus array is chosen as indicated at a block 220, and operations continue at block 214. When an LBIST fail change is identified, the focus array is logged as failing with first signature (S1) as indicated at a decision block 222, and operations continue at decision block 218. When all select arrays are tried, then operation goes to the array repair sequence as indicated at a block 224.

In accordance with features of the invention, first, if a failure exists on one of the two edge columns 102 then the walking repair will result in only two signatures S1 and S2, and one of those will occur only once. The repair that created that single instance signature will indicate which edge to repair. Second, a non-edge fail will results in three signatures, S1, S2 and S3. For most locations one of these will occur only once, which indicates the location of the repair. On the two locations just inside of the edge columns, two of the three signatures will have a single instance. The single occurrence signature on the repair of the column just inside the edge indicated the location of the fail. Note when the repair is found it is applied before the next isolation as one array repair may effect the repair of another. One other three signature pattern results when both edge columns fail. In this case the two single occurring signatures are when each edge is repaired. This pattern and any other with 4 or more signatures indicates that the array cannot be repaired.

Figure 3:
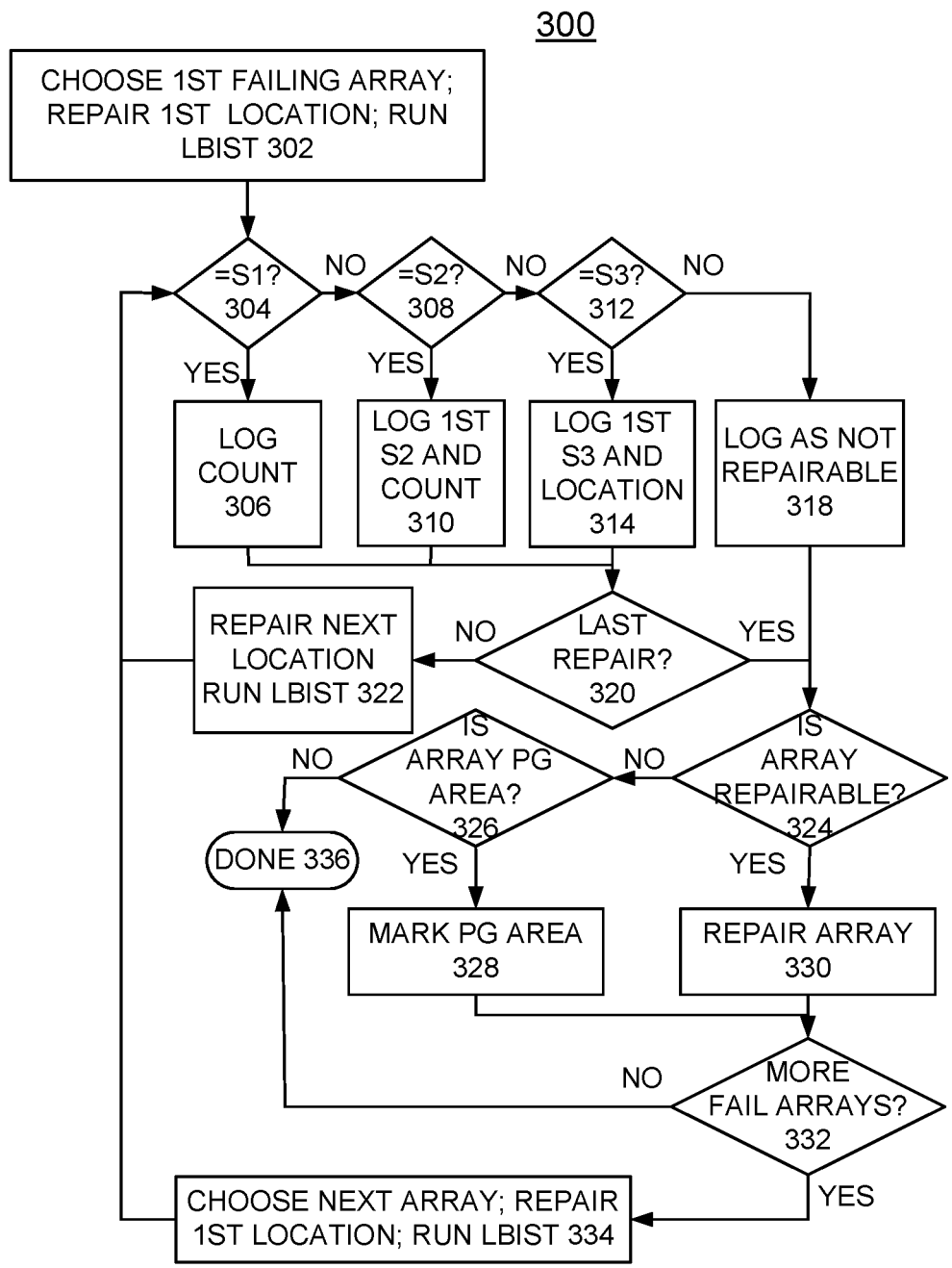
FIG. 3 is a flow chart illustrating example operations for implementing register array repair using Logic Built In Self Test (LBIST) of FIGS. 1A, 1B, 1C including example operations allowing isolation of the repair solution for each array of FIG. 2 in accordance with preferred embodiments.

Referring also to FIG. 3, there are shown example operations for implementing register array repair using Logic Built In Self Test (LBIST) of FIGS. 1A, 1B, 1C including example operations allowing isolation of the repair solution for each array of FIG. 2 generally designated by the reference character 300 in accordance with preferred embodiments. A first failing array is chosen, a first location is repaired, and LBIST is run as indicated at a block 302. Checking for the first signature (S1) is performed as indicated at a decision block 304. When the first signature (S1) is identified, a count is logged as indicated at a block 306. When the first signature (S1) is not identified, checking for the second signature (S2) is performed as indicated at a decision block 308. When the second signature (S2) is identified, the second signature S2 and a count are logged as indicated at a block 310. When the second signature (S2) is not identified, checking for the third signature (S3) is performed as indicated at a decision block 312. When the third signature (S3) is identified, the third signature S3 and a count are logged as indicated at a block 314. When the third signature (S3) is not identified, not repairable is logged as indicated at a block 318. After logging is performed at either of blocks 306, 310, or 314, checking for the last repair is performed as indicated at a decision block 320. When the last repair is not identified, a next location is repaired and LBIST is run as indicated at a block 322. After logging is performed at 318 and after the last repair is identified, checking if the array is repairable is performed as indicated at a decision block 324. When the array is not repairable, checking if the non-repairable array is in a non-critical area, such as a partial good (PG) area as indicated at a decision block 326. If the array is in a partial good (PG) area, repair isolation can be continued on the next array. The array is marked as PG area as indicated at a block 328. When the array is repairable, the array is repaired as indicated at a block 330. Checking for more fail arrays is performed as indicated at a decision block 332. With more fail arrays identified, a next array is chosen, the first location is repaired and LBIST is run as indicated at a block 334. Otherwise, when determined array is not in PG area at decision block 326, and when more fail arrays are not identified, then the operations are completed as indicated at a block 336.

In accordance with features of the invention, while this method typically focuses on the new repairable RAs, such as shown in FIGS. 1A, 1B, 1C, the method may be applied for arrays having ABIST. Though less common, these ABIST arrays have been seen to pass ABIST, but fail when used during LBIST. Today, such ABIST arrays would be declared bad, and unless in a partial good area, the part is declared bad. Now a repair may be attempted based on LBIST detection, and a version of the isolation procedure, such as illustrated in FIG. 3.

In accordance with features of the invention, the method of FIG. 3 includes repair before isolation and repair of the next array, since a fail in one array may actually cause another to fail, further optimization also could prioritize the order of isolation. Also rather than walk through all repairs, a further optimization includes a binary search for Multiple Input Signature Register (MISR) changes that could reduce the number of iterations. Notably if a center repair does not change the MISR, then all repairs between it and the original would also have produced the same signature. While this has a significant potential reduction for single defects, multiple defects often require the most iterations. Similarly, a particular MISR fail may only be possible from a subset of the repairable arrays, so only those arrays need to follow the isolation procedure above. Or if two MISRs fail with unrelated array sets, then it may be possible to repair two or more arrays at a time. Each MISR would then in parallel follow the above procedure.

In accordance with features of the invention, effectiveness of the LBIST repair methodology can be improved with knowledge of the correct signature (after all other arrays are repaired), that can help point to the correct repair; however, if multiple arrays have these symptoms then multiple combinations may need to be tried.

Figure 4:
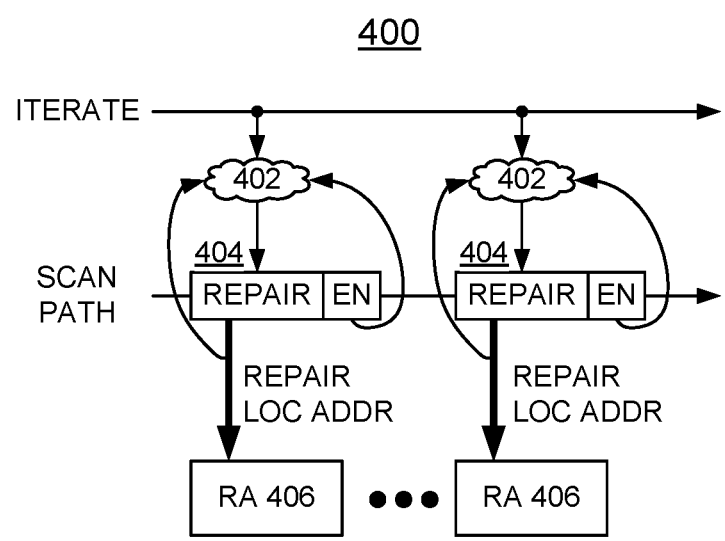
FIG. 4 illustrates an example hardware for implementing register array repair using Logic Built In Self Test (LBIST) of FIGS. 1A, 1B, 1C including a selectable iterate on each arrays repair data segment in accordance with preferred embodiments.

In accordance with features of the invention, effectiveness of the LBIST repair methodology can be improved with a selectable iterate on each arrays repair data segment, for example, as illustrated and described with respect to FIG. 4. Currently the entire repair chain ring would be reloaded with every repair trial, so making that more efficient also helps, such as with the selectable iterate on each arrays repair data segment.

Referring also to FIG. 4 illustrates an example hardware for implementing register array repair using Logic Built In Self Test (LBIST) of FIGS. 1A, 1B, 1C including a circuit for selectable iterate on each arrays repair data segment generally designated by the reference character 400 in accordance with preferred embodiments.

Selectable iterate circuit 400 for selectable iterate on each arrays repair data segment includes an iterate logic 402 connected between an iterate input and a repair and enable logic 404. A scan path is applied to the repair and enable logic 404 that is coupled via a repair location address to a respective RA 406. The selectable iterate circuit 400 enables the selectable iterate on each arrays repair data segment. A single scan to load the enable latch 404 for each focus array allows only the focus arrays to iterate through the repair trials when a trigger signal from LBIST or a chip pin occurs, eliminating most of the repeated scanning, as illustrated in FIG. 4. Other options include the iterating and enable logic in the array or LBIST logic or a combination of each. Creating a dedicated RA repair chain also reduced the data and iteration time significantly. Scan time for signature reading also could be reduced by using a parallel observation interface, such as currently being used by OPMISR+). However this typically compresses multiple signatures, conflicting with the other optimization techniques that require separate signatures.

Figure 5:
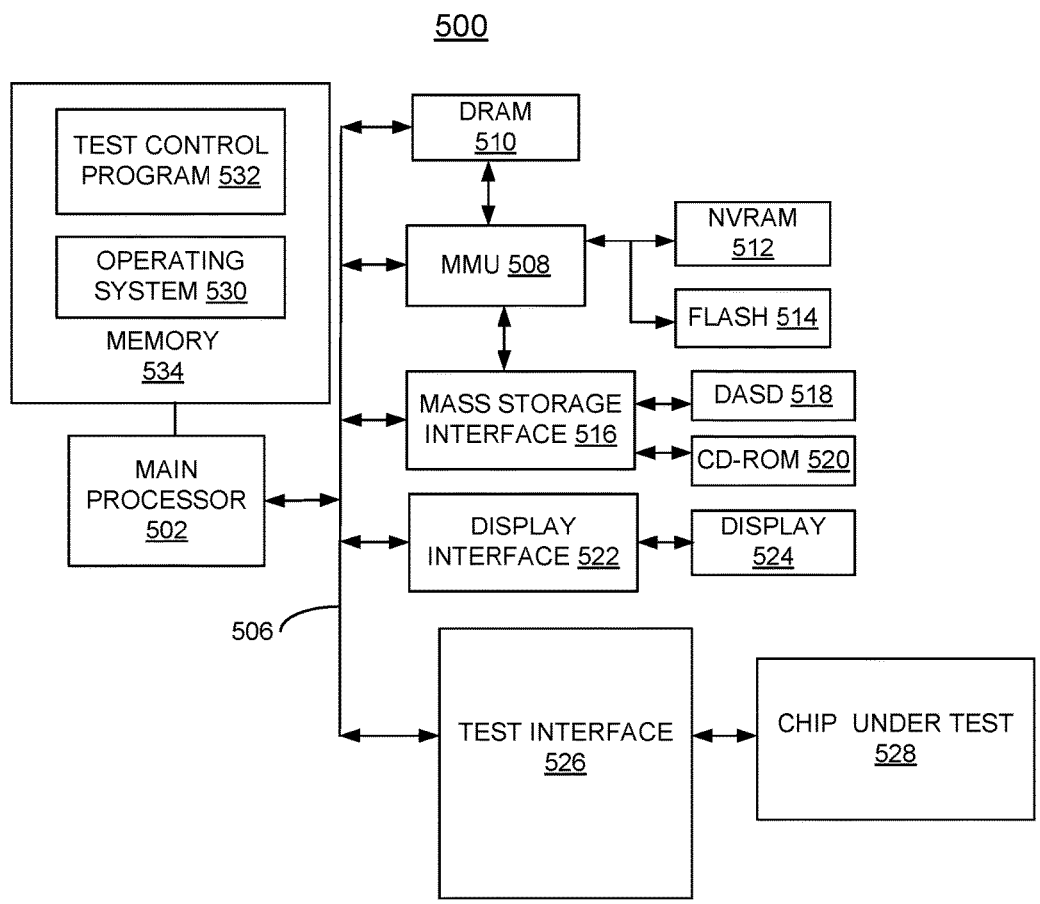
FIG. 5 is a block diagram representation illustrating an exemplary computer test system for implementing register array repair using Logic Built In Self Test (LBIST) in accordance with preferred embodiments.

Referring now to FIG. 5, there is shown an exemplary computer test system for implementing register array repair using Logic Built In Self Test (LBIST) generally designated by the reference character 500 in accordance with the preferred embodiment. Computer system 500 includes a main processor 502 or central processor unit (CPU) 502 coupled by a system bus 506 to a memory management unit (MMU) 508 and system memory including a dynamic random access memory (DRAM) 510, a nonvolatile random access memory (NVRAM) 512, and a flash memory 514. A mass storage interface 516 coupled to the system bus 506 and MMU 508 connects a direct access storage device (DASD) 518 and a CD-ROM drive 520 to the main processor 502. Computer system 500 includes a display interface 522 connected to a display 524, and a test interface 526 coupled to the system bus 506. An integrated circuit device or chip under test 528 is coupled to the test interface 526. Computer system 500 includes an operating system 530, and a test control program 532 of the preferred embodiment resident in a memory 534.

Computer test system 500 is shown in simplified form sufficient for understanding the present invention. The illustrated computer test system 500 is not intended to imply architectural or functional limitations. The present invention can be used with various hardware implementations and systems and various other internal hardware devices, for example, multiple main processors.

Figure 6:
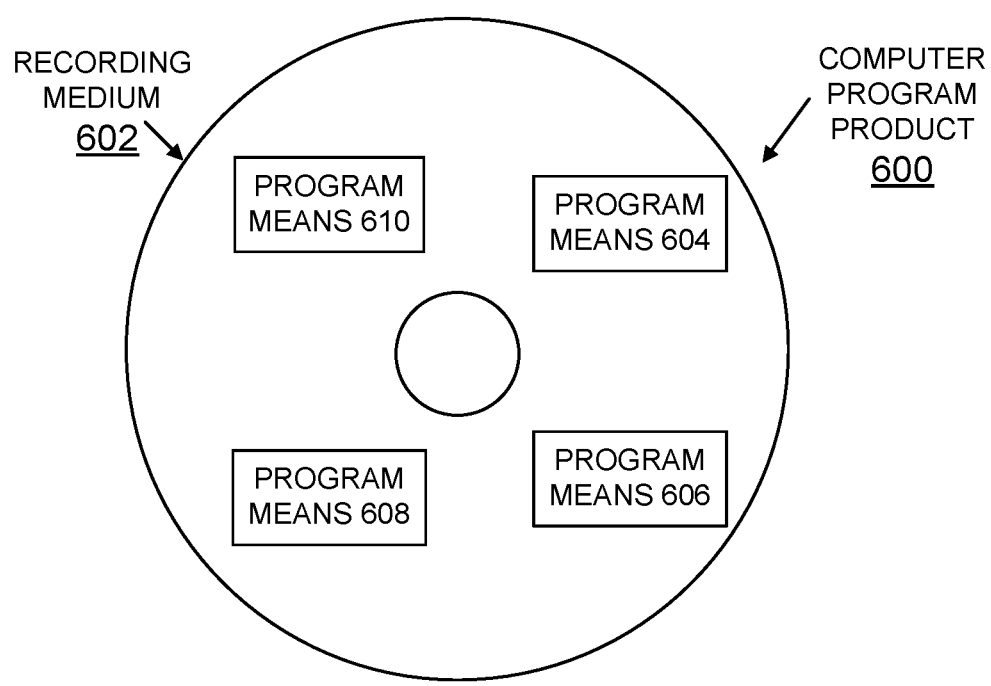
FIG. 6 is a block diagram illustrating a computer program product in accordance with the preferred embodiments.

Referring now to FIG. 6, an article of manufacture or a computer program product 600 of the invention is illustrated. The computer program product 600 includes a recording medium 602, such as, a floppy disk, a high capacity read only memory in the form of an optically read compact disk or CD-ROM, a tape, or another similar computer program product. Recording medium 602 stores program means 604, 606, 608, and 610 on the medium 602 for carrying out the methods for implementing register array repair using Logic Built In Self Test (LBIST) of the preferred embodiment with the example circuit of FIGS. 1A, 1B, and 1C and the system 500 of FIG. 5.

A sequence of program instructions or a logical assembly of one or more interrelated modules defined by the recorded program means 604, 606, 608, and 610, direct the computer system 500 for implementing register array repair using Logic Built In Self Test (LBIST) of the preferred embodiment.

Figure 7:
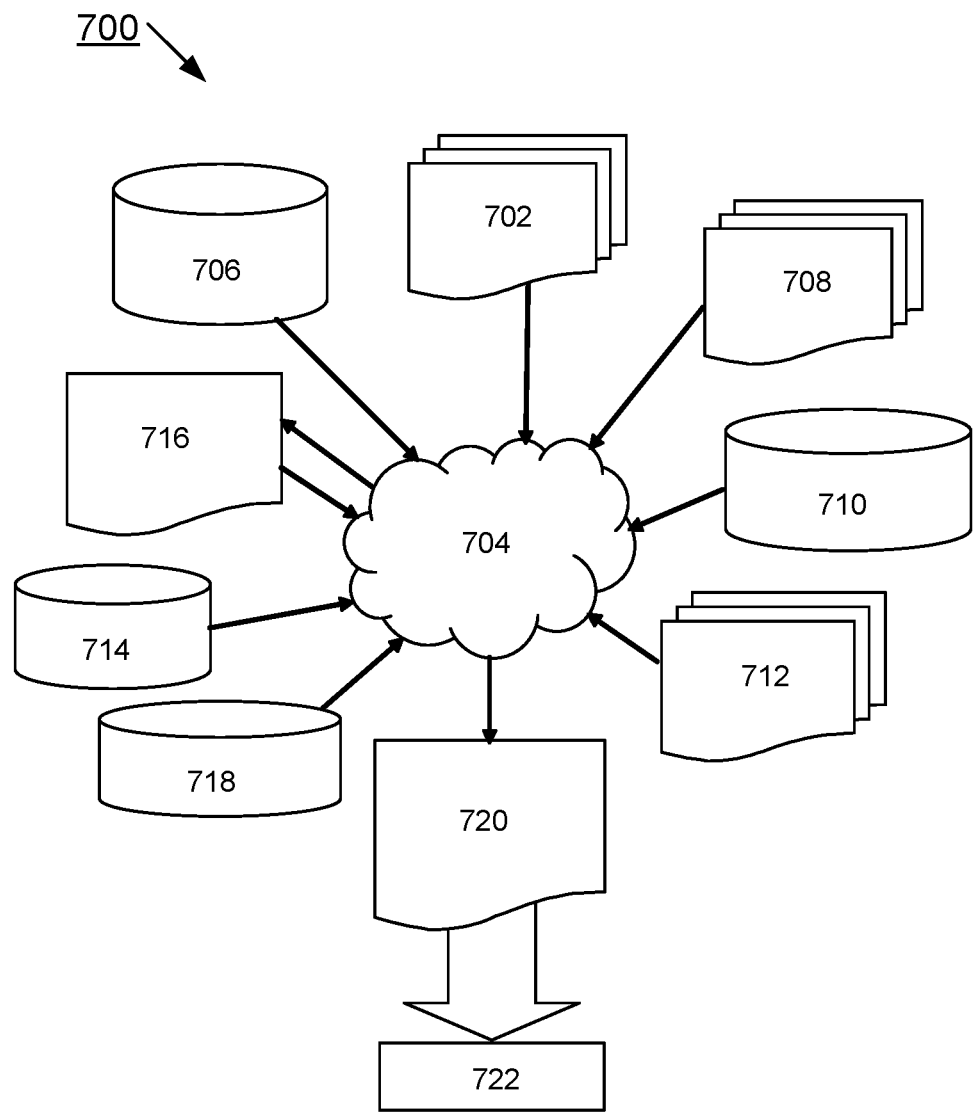
FIG. 7 is a flow diagram of a design process used in semiconductor design, manufacturing, and/or test.

FIG. 7 shows a block diagram of an example design flow 700. Design flow 700 may vary depending on the type of IC being designed. For example, a design flow 700 for building an application specific IC (ASIC) may differ from a design flow 700 for designing a standard component. Design structure 702 is preferably an input to a design process 704 and may come from an IP provider, a core developer, or other design company or may be generated by the operator of the design flow, or from other sources. Design structure 702 comprises circuits 100, 110, 120, 200, 300, 400 in the form of schematics or HDL, a hardware-description language, for example, Verilog, VHDL, C, and the like. Design structure 702 may be contained on one or more machine readable medium. For example, design structure 702 may be a text file or a graphical representation of circuits 100, 110, 120, 200, 300, 400. Design process 704 preferably synthesizes, or translates, circuit 100 into a netlist 706, where netlist 706 is, for example, a list of wires, transistors, logic gates, control circuits, I/O, models, etc. that describes the connections to other elements and circuits in an integrated circuit design and recorded on at least one of machine readable medium. This may be an iterative process in which netlist 706 is resynthesized one or more times depending on design specifications and parameters for the circuit.

Design process 704 may include using a variety of inputs; for example, inputs from library elements 708 which may house a set of commonly used elements, circuits, and devices, including models, layouts, and symbolic representations, for a given manufacturing technology, such as different technology nodes, 32 nm, 45 nm, 70 nm, and the like, design specifications 710, characterization data 712, verification data 714, design rules 716, and test data files 718, which may include test patterns and other testing information. Design process 704 may further include, for example, standard circuit design processes such as timing analysis, verification, design rule checking, place and route operations, and the like. One of ordinary skill in the art of integrated circuit design can appreciate the extent of possible electronic design automation tools and applications used in design process 704 without deviating from the scope and spirit of the invention. The design structure of the invention is not limited to any specific design flow.

Design process 704 preferably translates an embodiment of the invention as shown in FIGS. 1A, 1B, 1C, 2, 3, and 4 along with any additional integrated circuit design or data (if applicable), into a second design structure 720. Design structure 720 resides on a storage medium in a data format used for the exchange of layout data of integrated circuits, for example, information stored in a GDSII (GDS2), GL1, OASIS, or any other suitable format for storing such design structures. Design structure 720 may comprise information such as, for example, test data files, design content files, manufacturing data, layout parameters, wires, levels of metal, vias, shapes, data for routing through the manufacturing line, and any other data required by a semiconductor manufacturer to produce an embodiment of the invention as shown in FIGS. 1A, 1B, 1C, 2, 3, and 4. Design structure 720 may then proceed to a stage 722 where, for example, design structure 720 proceeds to tape-out, is released to manufacturing, is released to a mask house, is sent to another design house, is sent back to the customer, and the like.

While the present invention has been described with reference to the details of the embodiments of the invention shown in the drawing, these details are not intended to limit the scope of the invention as claimed in the appended claims.

What is claimed is:

1. A circuit for implementing register array repair using Logic Built In Self Test (LBIST), said circuit comprising:
    a plurality of Register Arrays (RAs), each RA enabling a single repair;
    a processor, said processor performing the steps of:
    applying random pattern test to the plurality of Register Arrays (RAs) using Logic Built In Self Test (LBIST) for identifying a respective LBIST fail result by checking for LBIST fail, responsive to an LBIST fail, performing full repair for all select arrays, checking for LBIST change, responsive to an LBIST change, choosing a focus array and performing full repair for the focus array, checking for LBIST change, responsive to an LBIST change logging the focus array as failing with a first signature, responsive to processing all select arrays, going to an array repair sequence;
    generating a list of any repairable Register Arrays (RAs) responsive to each said identified respective LBIST fail result; and
    performing an array repair solution for each of the repairable Register Arrays (RAs) in the list by isolating a failing location for each array; choosing a failing array, replacing a failing location by replacing a failing bit column with a next adjacent column, the next adjacent column is further replaced by its next adjacent column, until all next adjacent columns to the failure are shifted, and logical read and write paths are similarly shifted to working locations, and repairing a next failing array and running LBIST.

2. The circuit as recited in claim 1 wherein each of the plurality of Register Arrays (RAs) includes a selectable iterate on each array repair data segment, said selectable iterate including an enable latch in a scan path for each focus array to allow iterating through repair trials responsive to a trigger signal from LBIST.

3. The circuit as recited in claim 1 wherein performing said array repair solution for each of the repairable Register Arrays (RAs) for isolating a failing location for each array, choosing a fail array, repairing a failing location, and running LBIST includes checking for a signature, and logging an identified signature, checking for a last repair in the failing array, repairing the array responsive to identifying the last repair, and checking for more fail arrays, choosing a next failing array, repairing a failing location, and running LBIST for the next failing array.

4. The circuit as recited in claim 1 wherein generating said list of any repairable Register Arrays (RAs) responsive to each said respective LBIST fail result includes performing a full repair on all select arrays responsive to each said respective LBIST fail, and checking for an LBIST fail change.

5. The circuit as recited in claim 4 includes choosing a focus array responsive to an identified LBIST fail change and performing a full repair on the focus array, and checking for a second LBIST fail change.

6. The circuit as recited in claim 5 includes logging the focus array as failing with a first signature responsive to the second LBIST fail change and choosing a next focus array for processing.

7. A design structure embodied in a non-transitory machine readable medium for designing, manufacturing, or testing an integrated circuit, the design structure comprising:
    a circuit tangibly embodied in the non-transitory machine readable used in a design process, said circuit for implementing register array repair using Logic Built In Self Test (LBIST), said circuit comprising:
    a plurality of Register Arrays (RAs), each RA enabling a single repair;
    a processor, said processor performing the steps of:
    applying random pattern test to the plurality of Register Arrays (RAs) using Logic Built In Self Test (LBIST) for identifying a respective LBIST fail result by checking for LBIST fail, responsive to an LBIST fail, performing full repair for all select arrays, checking for LBIST change, responsive to an LBIST change, choosing a focus array and performing full repair for the focus array, checking for LBIST change, responsive to an LBIST change logging the focus array as failing with a first signature, responsive to processing all select arrays, going to an array repair sequence;
    generating a list of any repairable Register Arrays (RAs) responsive to each said identified respective LBIST fail result; and
    performing an array repair solution for each of the repairable Register Arrays (RAs) in the list by isolating a failing location for each array; choosing a failing array, repairing a failing location by replacing a failing bit column with a next adjacent column, the next adjacent column is further replaced by its next adjacent column, until all next adjacent columns to the failure are shifted, and logical read and write paths are similarly shifted to working locations, and repairing a next failing array and running LBIST, wherein the design structure, when read and used in the manufacture of a semiconductor chip produces a chip comprising said circuit.

8. The design structure of claim 7, wherein the design structure comprises a netlist, which describes said circuit.

9. The design structure of claim 7, wherein the design structure resides on storage medium as a data format used for the exchange of layout data of integrated circuits.

10. The design structure of claim 7, wherein the design structure includes at least one of test data files, characterization data, verification data, or design specifications.

11. The design structure of claim 7, wherein each of the plurality of Register Arrays (RAs) includes a selectable iterate on each array repair data segment, said selectable iterate including an enable latch in a scan path for each focus array to allow iterating through repair trials responsive to a trigger signal from LBIST.

12. The design structure of claim 11, wherein performing said array repair solution for each of the repairable Register Arrays (RAs) for isolating a failing location for each array, choosing a fail array, repairing a failing location, and running LBIST includes checking for a signature, and logging an identified signature, checking for a last repair in the failing array, repairing the array responsive to identifying the last repair, and checking for more fail arrays, choosing a next failing array, repairing a failing location, and running LBIST for the next failing array.

13. The design structure of claim 7, wherein generating said list of any repairable Register Arrays (RAs) responsive to each said respective LBIST fail result includes performing a full repair on all select arrays responsive to each said respective LBIST fail, and checking for an LBIST fail change.

14. The design structure of claim 13, includes choosing a focus array responsive to an identified LBIST fail change and performing a full repair on the focus array, and checking for a second LBIST fail change.

15. The design structure of claim 14, includes logging the focus array as failing with a first signature responsive to the second LBIST fail change and choosing a next focus array for processing.

16. A method for implementing register array repair using Logic Built In Self Test (LBIST), said method comprising:
providing a plurality of Register Arrays (RAs), each RA enabling a single repair;
providing a processor, said processor performing the steps of:
applying random pattern test to the plurality of Register Arrays (RAs) using Logic Built In Self Test (LBIST) for identifying a respective LBIST fail result by checking for LBIST fail, responsive to an LBIST fail, performing full repair for all select arrays, checking for LBIST change, responsive to an LBIST change, choosing a focus array and performing full repair for the focus array, checking for LBIST change, responsive to an LBIST change logging the focus array as failing with a first signature, responsive to processing all select arrays, going to an array repair sequence;
identifying and generating a list of any repairable Register Arrays (RAs) responsive to each identified respective LBIST fail result;
performing an array repair solution for each identified repairable Register Arrays (RAs) in the list, and isolating of a failing location for each array, choosing a failing array, repairing a failing location by replacing a failing bit column with a next adjacent column, the next adjacent column is further replaced by its next adjacent column, until all next adjacent columns to the failure are shifted, and logical read and write paths are similarly shifted to working locations, and repairing a next failing array and running LBIST.

17. The method as recited in claim 16 includes providing each of the plurality of Register Arrays (RAs) with a selectable iterate on each array repair data segment, said selectable iterate including an enable latch in a scan path for each focus array to allow iterating through repair trials responsive to a trigger signal from LBIST.

18. The method as recited in claim 16 wherein an array repair solution for each identified repairable Register Arrays (RAs) in the list, and isolating of a failing location for each array choosing a fail array, repairing a failing location, and running LBIST includes checking for a signature, and logging an identified signature, checking for a last repair in the failing array, repairing the array responsive to identifying the last repair, and checking for more fail arrays, choosing a next failing array, repairing a failing location, and running LBIST for the next failing array.

19. The method as recited in claim 16 wherein identifying and generating a list of any repairable Register Arrays (RAs) responsive to each said identified respective LBIST fail result includes performing a full repair on all select arrays responsive to an LBIST fail, and checking for a LBIST fail change, choosing a focus array responsive to the LBIST fail change and performing a full repair on the focus array, and checking for a second LBIST fail change.

20. The method as recited in claim 19 includes logging the focus array as failing with a first signature responsive to the second LBIST fail change and choosing a next focus array for processing.

* * * * *